(12) United States Patent
Tai et al.

(10) Patent No.: US 11,752,729 B2
(45) Date of Patent: Sep. 12, 2023

(54) CONFORMABLE COLOR SHIFTING LAMINATES

(71) Applicant: 3M INNOVATIVE PROPERTIES COMPANY, St. Paul, MN (US)

(72) Inventors: Huiwen Tai, Lake Elmo, MN (US); Joan M. Frankel, Woodbury, MN (US); Stephen P. Maki, North St. Paul, MN (US); Diane North, Inver Grove Heights, MN (US); Robert R. Owings, Woodbury, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 212 days.

(21) Appl. No.: 17/260,459

(22) PCT Filed: Jul. 15, 2019

(86) PCT No.: PCT/IB2019/056033
§ 371 (c)(1),
(2) Date: Jan. 14, 2021

(87) PCT Pub. No.: WO2020/016753
PCT Pub. Date: Jan. 23, 2020

(65) Prior Publication Data
US 2021/0308984 A1    Oct. 7, 2021

Related U.S. Application Data

(60) Provisional application No. 62/699,337, filed on Jul. 17, 2018.

(51) Int. Cl.
*G02B 5/08* (2006.01)
*B32B 7/023* (2019.01)
(Continued)

(52) U.S. Cl.
CPC .............. *B32B 7/023* (2019.01); *B32B 7/022* (2019.01); *B32B 7/12* (2013.01); *B32B 15/08* (2013.01);
(Continued)

(58) Field of Classification Search
CPC ........ G02B 5/26; G02B 5/085; G02B 5/0875; G02B 5/0858; G02B 5/0866; B32B 7/023;
(Continued)

(56) References Cited

U.S. PATENT DOCUMENTS

RE24,906 E    12/1960  Ulrich
3,239,478 A    3/1966  Harlan, Jr.
(Continued)

FOREIGN PATENT DOCUMENTS

DE    202018000871    4/2018
EP    0786676    7/1997
(Continued)

OTHER PUBLICATIONS

International Search Report for PCT International Application No. PCT/IB2019/056033, dated Dec. 20, 2019, 3 pages.

*Primary Examiner* — Ruiyun Zhang
(74) *Attorney, Agent, or Firm* — Vincent L. Pham

(57) ABSTRACT

A stretchable reflective color-shifting film comprises a stretchable transparent polymer layer; a semi-transmissive metal layer; a transparent spacer layer; a reflective metal layer; an adhesive layer; and a stretchable base film layer. When the film body is stretched by 25%, the peak total reflectance stretched is at 80% of the peak total reflectance when the film body is unstretched according to the Total Reflectivity Test.

16 Claims, 11 Drawing Sheets

(51) Int. Cl.
*B32B 7/022* (2019.01)
*B32B 7/12* (2006.01)
*B32B 15/08* (2006.01)
*B32B 15/20* (2006.01)
*B32B 27/06* (2006.01)
*G02B 5/26* (2006.01)

(52) U.S. Cl.
CPC .............. *B32B 15/20* (2013.01); *B32B 27/06* (2013.01); *G02B 5/085* (2013.01); *G02B 5/0875* (2013.01); *G02B 5/26* (2013.01); *B32B 2307/404* (2013.01); *B32B 2307/412* (2013.01); *B32B 2307/414* (2013.01); *B32B 2307/416* (2013.01); *B32B 2307/54* (2013.01); *B32B 2307/732* (2013.01); *G02B 5/0866* (2013.01)

(58) Field of Classification Search
CPC ..... B32B 7/12; B32B 15/20; B32B 2307/404; B32B 2307/412; B32B 2307/416
USPC .................................. 428/1.3; 359/597, 584
See application file for complete search history.

(56) References Cited

U.S. PATENT DOCUMENTS

| | | |
|---|---|---|
| 3,935,338 A | 1/1976 | Robertson |
| 4,101,698 A | 7/1978 | Dunning |
| 4,181,752 A | 1/1980 | Martens |
| 4,705,356 A | 11/1987 | Berning |
| 4,952,650 A | 8/1990 | Young |
| 5,059,245 A | 10/1991 | Phillips |
| 5,169,727 A | 12/1992 | Boardman |
| 5,945,174 A | 8/1999 | Shaw |
| 6,010,751 A | 1/2000 | Shaw |
| 6,157,489 A | 12/2000 | Bradley, Jr. |
| 6,521,036 B1 | 2/2003 | Bleikolm |
| 6,565,770 B1 | 5/2003 | Mayer |
| 6,686,042 B1 | 2/2004 | LeGallee |
| 6,858,287 B2 | 2/2005 | Fields |
| 7,140,741 B2 | 11/2006 | Fleming |
| 8,153,270 B2 | 4/2012 | Akieda |
| 9,864,112 B1 | 1/2018 | Jeannette |
| 2004/0219366 A1 | 11/2004 | Johnson |
| 2009/0053337 A1 | 2/2009 | Hansenne |
| 2011/0262754 A1 | 10/2011 | Zehentmaier |
| 2012/0236528 A1 | 9/2012 | Le |
| 2016/0306084 A1 | 10/2016 | Padiyath |

FOREIGN PATENT DOCUMENTS

| | | |
|---|---|---|
| JP | 05195205 | 8/1993 |
| WO | WO 1998-018852 | 5/1998 |
| WO | WO 2009-085741 | 7/2009 |
| WO | WO 2010-032783 | 3/2010 |
| WO | WO 2015-087770 | 6/2015 |

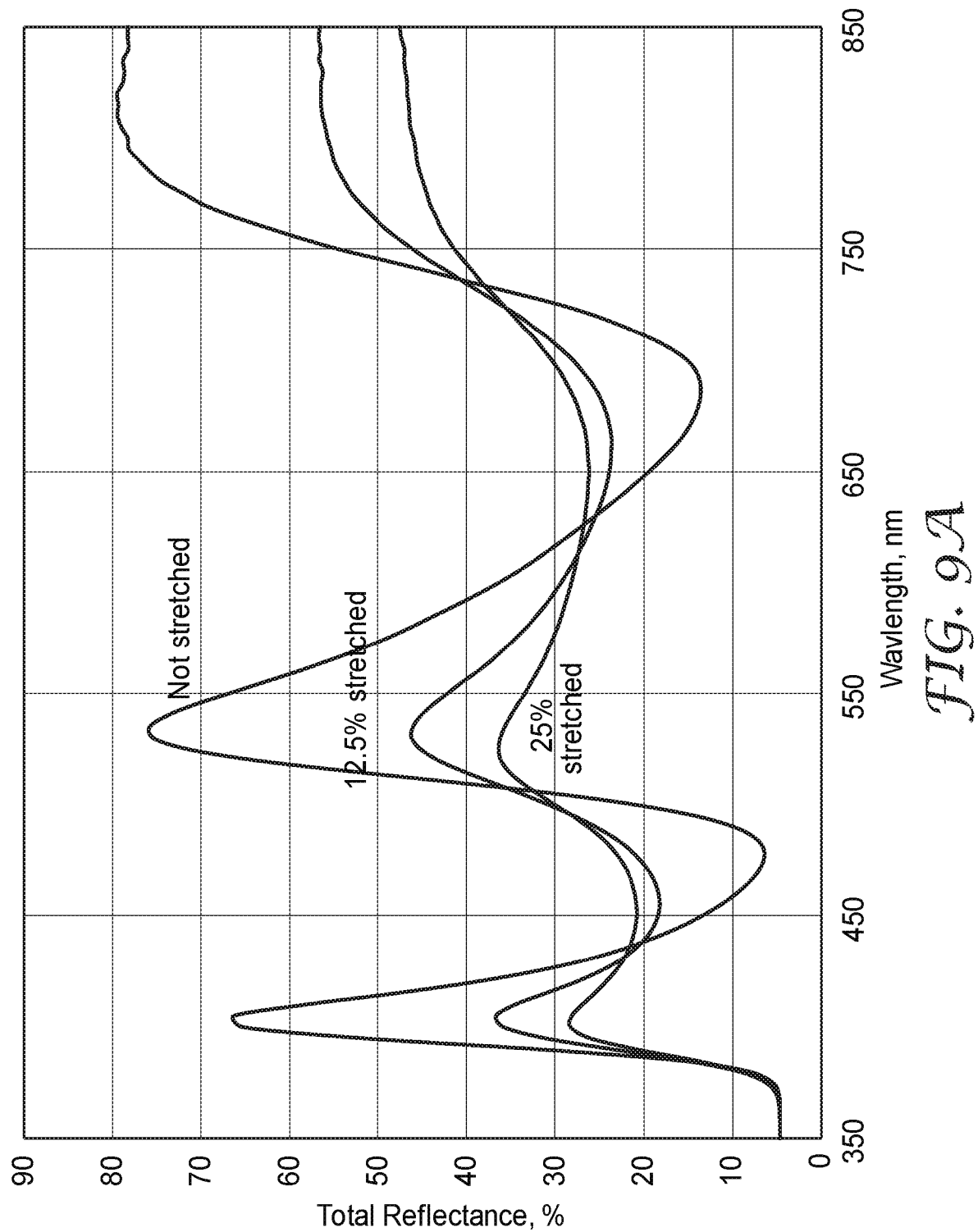

US 11,752,729 B2

CONFORMABLE COLOR SHIFTING LAMINATES

TECHNICAL FIELD

The present disclosure relates to a stretchable film that is reflective and has color features. More specifically, the present disclosure relates to a color-shifting stretchable reflective film.

BACKGROUND

Colored and graphic films are used for a wide variety of applications, including wrapping the surface of personal or commercial vehicles, buildings, and other interior and exterior surfaces. When applied to vehicles, graphic films can provide a cost-effective alternative to repainting a vehicle. Additionally, graphic films can typically be removed, which allows for a more temporary color change when compared to paint.

Metallized films are a popular category of graphic films. Metallized films, in particular, can provide a decorative look, or specular mirror reflection, that is simpler and more cost effective than traditional chrome plating. However, manufacturing a metallized reflective film that is conformable, such that it stretches to the shape of a three-dimensional surface, has visual uniformity and reflection and remains in place when applied in deep channels or around sharp radii, is very challenging. Even further, being able to provide color and color shifting characteristics in combination with reflectivity and conformability is challenging. Color shifting characteristics create an appearance of two or more colors in the film depending on the viewing angle of the observer. The same area of film can appear to be a first color when viewed from a first angle and a second color when viewed from a second angle.

There remains opportunity to create an improved stretchable reflective color-shifting film.

SUMMARY

The present invention provides several benefits and solves several problems related to reflective or metallized color-shifting film. For example, stretching a metallized reflective color-shifting film, with or without heat, can result in haze and iridescence. This can result from cracking or disorientation of the metal itself, or from protective barrier layers cracking within the film. Some metallized reflective color-shifting films have stiff layers, like PET, in order to discourage the stretching or cracking that causes hazing but these types of films are difficult to apply to a three-dimensional surface as well. They also may have a tendency to lift or pull away from a complex surface after application. Because color-shifting reflective film typically contains metal, corrosion can also cause film deterioration. This is particularly true when the film is exposed to moisture, which is typical of films applied to vehicles.

The present disclosure provides several advantages in light of the challenges discussed herein. For example, the present disclosure provides a color-shifting reflective film that can be stretched while maintaining a high level of total reflectance.

In one instance, the present disclosure includes a stretchable reflective color-shifting film including a stretchable transparent polymer layer; a semi-transmissive metal layer; a transparent spacer layer; a reflective metal layer; an adhesive layer; and a stretchable base film layer. When the film body is stretched by 25%, the peak total reflectance stretched is at 80% of the peak total reflectance when the film body is unstretched according to the Total Reflectivity Test.

In another instance, the present disclosure includes a stretchable reflective color-shifting film comprising a stretchable transparent polymer layer; a semi-transmissive metal layer; a transparent spacer layer; a reflective metal layer; an adhesive layer; and a stretchable base film layer. When the film body is stretched by 25%, the peak specular reflection is at least 30% at a normal angle.

In some instances, the present disclosure further includes a second transparent spacer layer and a second semi-transmissive metal layer.

In some instances, the transparent spacer layer comprises an organic material.

In some instances, the adhesive layer comprises a non-reactive adhesive.

In some instances, the reflective metal layer is continuous.

In some instances, the semi-transmissive metal layer comprises at least one of tin, aluminum or indium.

In some instances, the reflective metal layer comprises at least one of tin, aluminum or indium.

In some instances, the semi-transmissive metal layer and the reflective metal layer comprise the same type of metal.

In some instances, at least one of the semi-transmissive layers and the reflective metal layer comprises more than one type of metal.

In some instances, the color-shifting film further comprises a user adhesive layer disposed on the side of the stretchable base film layer opposite the adhesive layer.

In some instances, the color shifting film further comprises a structured liner adjacent to the user adhesive layer, wherein the structured liner comprises ridges, which form channels in the user adhesive layer.

In some instances, the spacer layer has a thickness in the range of 350 nm to 700 nm.

BRIEF DESCRIPTION OF DRAWINGS

The invention may be more completely understood when considered with the following detailed description in connection with the accompanying drawings in which:

FIGS. 9A and 9B show the total reflectivity spectra of Comparative Examples CE3 and CE4, respectively.

The embodiments shown and described herein may be utilized and structural changes may be made without departing from the scope of the invention. The figures are not necessarily to scale. Like numbers used in the figures refer to like components. However, the use of a number to refer to a component in a given figure is not intended to limit the component in another figure labeled with the same number.

DETAILED DESCRIPTION

Figure 1:
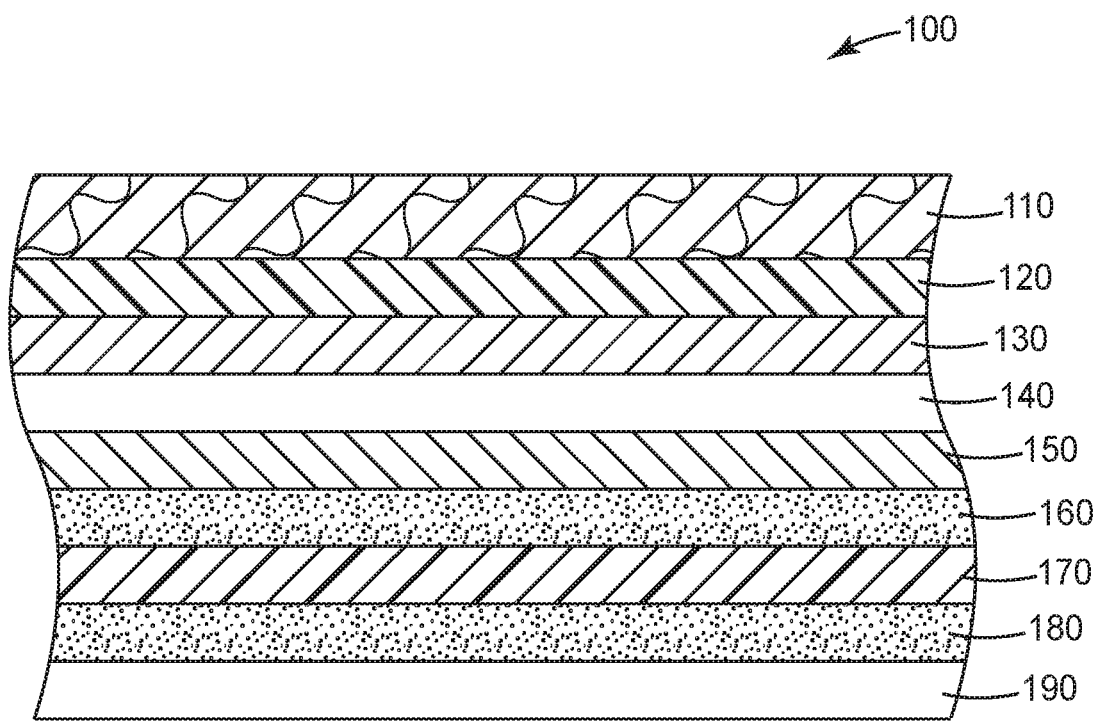
FIG. 1 is an exemplary cross section of a stretchable reflective color-shift film consistent with the present disclosure.

FIG. 1 is an exemplary cross section of a stretchable reflective color-shift film 100 consistent with the present disclosure. Stretchable reflective color-shift film 100 includes (from bottom to top) adhesive liner 190; adhesive layer 180; stretchable film layer 170; adhesive layer 160; reflective metal layer 150; spacer layer 140; semi-transmissive metal layer 130; transparent polymer layer 120 and removable liner 110.

In some manufacturing processes, each of layers 120, 130, 140, 150 and optionally layer 160 may be successively deposited onto liner 110, and this stack of layers can then be laminated to a separate stack that includes stretchable film layer 170, adhesive layer 180 and adhesive liner 190 adjacent to adhesive layer 180 to create color-shift film 100.

While FIG. 1 shows eight layers, a film consistent with the present disclosure may have more or fewer layers. In FIG. 1, layer 180 is an adhesive layer used to adhere the color-shift film 100 to a surface. For this reason, layer 180 may also be described as a user adhesive layer. In many instances, the surface that a film consistent with the present disclosure is applied to may be a complex or three-dimensional surface. A film consistent with the present disclosure may be conformable, such that it can be stretched during the process of application to a complex or three-dimensional surface. A conformable film can materially or even completely take on the shape of a three-dimensional substrate containing convex features, concave features or a combination thereof. Of course, whether a film is conformable is not limited to situations in which is it actually applied to such a substrate, but simply that it displays the capability as described above. In some embodiments, taking on such shape is possible without a detrimental change to the structural integrity and/or the aesthetic appearance of the film. In this sense, conformable films are to be distinguished from non-conformable films that may be capable of being applied to planar surfaces and/or bent around surfaces that have a sufficiently large radius of curvature (such as a large cylinder), but which cannot, in practice, be applied satisfactorily to a more demanding three-dimensional substrate.

Factors that can influence the conformability of a film include the identity of the material used to make the film, the molecular weight of such material, the conditions to which such film is subjected (e.g., temperature, radiation exposure, and humidity), and the presence of additives in the film material (e.g., plasticizer content, reinforcing fibers, pigments, stabilizers (e.g., UV stabilizers), and hardness enhancing particles).

Adhesive layer 180 can be made from a variety of pressure sensitive adhesives. Adhesives are often selected based upon the type of substrate they are to be adhered to. Classes of pressure sensitive adhesives include acrylics, tackified rubber, tackified synthetic rubber, ethylene vinyl acetate, silicone, and the like. Suitable acrylic adhesives are disclosed, for example, in U.S. Pat. Nos. 3,239,478, 3,935, 338, 5,169,727, U.S. Pat. No. RE 24,906, U.S. Pat. Nos. 4,952,650, and 4,181,752.

A preferred class of pressure-sensitive adhesives are the reaction product of at least one alkyl acrylate with at least one reinforcing comonomer. Suitable alkyl acrylates are those having a homopolymer glass transition temperature below about −10 (degree) C. and include, for example, n-butyl acrylate, 2-ethylhexyl acrylate, isooctyl acrylate, isononlyl acrylate, octadecyl acrylate and the like. Suitable reinforcing monomers are those having a homopolymer glass transition temperature about −10 (degree) C., and include for example, acrylic acid, methylidenesuccinic acid, isobornyl acrylate, N,N-dimethylacrylamide, N-vinyl caprolactam, N-vinyl pyrrolidone, and the like.

The thickness of adhesive layer 180 is dependent upon several factors, including for example, the adhesive composition, whether the adhesive includes microstructured surfaces, the type of substrate, and the thickness of the film. Those skilled in the art are capable of adjusting the thickness to address specific application factors based on the disclosure herein. Adhesive layer 180 may be coated onto adhesive liner 190 and may then be laminated or otherwise adhered to stretchable film layer 170. In some instances, a liner adjacent to adhesive layer 180 may be a structured liner, wherein the structured liner comprises ridges which form channels in adhesive layer 180.

Stretchable film layer 170 may be a wide variety of cast or calendared polymeric films. Stretchable film layer 170 may be a vinyl film or a non-vinyl film. Examples of types of films consistent with the present disclosure include films made from a variety of polymers or polymer blends, including polyurethanes, polyesters, polyamides, polyolefins, polystyrenes, polycarbonates, polyacrylates, polyvinyl alcohol, polyvinyl butyral, polyvinyl chloride, and fluoropolymers. Commercially available films consistent with the present disclosure include 180mC 3M™ Controltac™ Graphic Film with Comply™ Adhesive and SV480mC 3M™ Envision™ Print Wrap Film.

Stretchable film layer 170 may be transparent, white or pigmented with a particular color. Stretchable film layer 170 may have a range of thicknesses. For example, stretchable film layer 170 may have a thickness of about 25 um, 50 um, 75 um, 100 um, 125 um, 150 um, 175 um, 200 um, or may have a thickness in a range between any of the two preceding thickness values.

The stack including adhesive layer 180 and stretchable film layer 170 may be laminated together with (for example, in a roll-to-roll lamination process) a second stack of layers 110, 120, 130, 140, 150 and optionally 160.

Liner 110 is typically a paper or polymeric liner with a coating to provide easy removal from transparent polymer layer 120. In some instances, liner 110 may have a very even, smooth or glossy surface to avoid creating any visual distortion of the light reflecting off of reflective metal layer 150 or semi-transmissive metal layer 130. In other instances, casting liner may have surface texture created by a method such as embossing or printing to give a hammered or textured appearance to reflective metal layer 150 and/or semi-transmissive metal layer 130. Liner 110 may also be referred to as a presize liner or a casting liner. Liner 110 also may have a rough surface opposite the surface facing transparent polymer layer 120. This rough or textured surface can prevent the transparent polymer layer 120 from sticking or adhering to the opposite surface of liner 110 when liner 110 and transparent polymer layer 120 are wound on a roll, and thereby preventing damage to the surface of transparent polymer layer 120 prior to coating of semi-transmissive metal layer 130 onto transparent polymer layer 120.

Transparent polymer layer 120 can be coated onto liner 110 using various coating methods. In some instances, transparent polymer layer 120 may be an extruded film or a calendared film. Transparent polymer layer 120 serves to provide a protective layer over semi-transmissive metal layer 130 in film 100. A transparent film is one that has a low haze value as measured by a BYK Hazegard based on ASTM D1003-11. For example, a transparent film may have a haze value of less than 25%, less than 20%, less than 15%, less than 10%, or less than 5%. Transparent polymer layer 120 may be made from a variety of polymers or polymer blends, including, for example polyurethanes, polyesters, polyamides, polyolefins, polystyrenes, polycarbonates, polyacrylates, polyvinyl alcohol, polyvinyl butyral, and fluoropolymers. Transparent polymer layer 120 may have a thickness of about 10 um, 15 um, 20 um, 25 um, 30 um, 40 um, 50 um, 60 um, 70 um, 80 um, 90 um, 100 um, 125 um, 150 um, 175 um or have a thickness in a range between any two preceding thickness values.

Semi-transmissive metal layer 130 is then deposited onto transparent polymer layer 120. Semi-transmissive metal layer 130 may include a variety of metals. For example, semi-transmissive metal layer 130 may include tin, indium, gold, aluminum, germanium or any alloys of these metals. Semi-transmissive metal layer 130 may include a single type of metal or may include a combination of metals. In some instances, semi-transmissive metal layer 130 includes at least 50%, 60%, 70%, 80%, 90%, 95% or 99%, 99.5%, 99.7% or 99.9% tin, indium or aluminum. Semi-transmissive metal layer 130 may be deposited using a variety of processes. Generally, a physical vapor deposition (PVD) process may be used. PVD describes a variety of vacuum deposition processes which can be used to produce a thin metal layer. In one instance, semi-transmissive metal layer 130 may be deposited using a sputtering deposition process under vacuum as described in the Examples. An alternative physical deposition method is evaporation. Semi-transmissive metal layer 130 may have a range of thicknesses. For example, semi-transmissive metal layer may be between 2 and 20 nm thick. In some instances semi-transmissive metal layer 130 may be 2 nm, 4 nm, 6 nm, 8 nm, 10 nm, 12 nm, 14 nm, 16 nm, 18 nm or any thickness in a range between any of the two proceeding values. Thickness of semi-transmissive metal layer 130 or reflective layer 150 can be measured using a variety of technologies, including a transmission electronic microscope (TEM). Factors that contribute to thickness may include a sufficiently thin coating such at least a portion of the incident light passes through semi-transmissive metal layer and sufficiently thick such that a portion of incident light reflects off of semi-transmissive metal layer 130, never reaching reflective metal layer 150. The thickness chosen for semi-transmissive metal layer 130 can impact the color range of the film, as demonstrated in the Examples. In some instances, the tolerance on the thickness of semi-transmissive metal layer 130 and reflective metal layer 150 can be relatively tight because if there is significant variance in the thickness of either of these layers, it results in visual inconsistencies due to the impact on reflected color.

Spacer layer 140 provides a gap between semi-transmissive metal layer 130 and reflective metal layer 150. Spacer layer 140 may be transparent, and may include a crosslinked polymethacrylate or polyacrylate materials, such as multi-functional or monofunctional (meth)acrylates, such as phenylthioethyl acrylate, hexanediol diacrylate, ethoxy ethyl acrylate, phenoxyethyl acrylate, cyanoethyl(mono)acrylate, isobornyl acrylate, isobornyl methacrylate, octadecyl acrylate, isodecyl acrylate, lauryl acrylate, β-carboxyethyl acrylate, tetrahydrofurfuryl acrylate, dinitrile acrylate, pentafluorophenyl acrylate, nitrophenyl acrylate, 2-phenoxyethyl acrylate, 2-phenoxyethyl methacrylate, 2,2,2-trifluoromethyl(meth)acrylate, diethyl ene glycol diacrylate, triethylene glycol diacrylate, triethylene glycol dimethacrylate, tripropylene glycol diacrylate, tetraethylene glycol diacrylate, neopentyl glycol diacrylate, propoxylated neopentyl glycol di acrylate, polyethylene glycol diacrylate, tetraethylene glycol diacrylate, bisphenol A epoxy diacrylate, 1,6-hexanediol dimethacrylate, trimethylol propane triacrylate, ethoxylated trimethylol propane triacrylate, propylated trimethylol propane triacrylate, 2-biphenyl acrylate, tris(2-hydroxyethyl)-isocyanurate triacrylate, pentaerythritol triacrylate, phenylthioethyl acrylate, naphthloxyethyl acrylate, EBECRYL 130 cyclic diacrylate (available from Cytec Surface Specialties, West Paterson, N.J.), epoxy acrylate RDX80095 (available from Rad-Cure Corporation, Fairfield, N.J.), CN120E50 and CN120C60 (both available from Sartomer, Exton, Pa.), and mixtures thereof. In some instances, Spacer layer 140 may include an organic or inorganic material, or a combination thereof. Spacer layer 140 may range in thickness from 90 nm to 700 nm. In some instances, spacer layer 140 may be 90, 100, 125, 150, 175, 200, 225, 250, 275, 300, 325, 350, 375, 400, 425, 450, 475, 500, 525, 550, 575, 600, 625, 650, 675, or 700 nm, or in a range between any two of these preceding thicknesses. One of the factors in choosing a thickness for spacer layer 140 is the desired range of color shown by the color shift film, as discussed herein.

Spacer layer 140 may be deposited using a variety of processes. In one instances, spacer layer may be deposited using a flash evaporation process. In some instances, layer 130 may first be plasma treated prior to deposition of spacer layer 140. Because spacer layer 140 is relatively thin, a flash evaporation and condensation process in a vacuum chamber can be used to deposit spacer layer on semi-transmissive metal layer 130. Other processes may be apparent to one skilled in the art upon reading the present disclosure.

Reflective metal layer 150 can be made from a variety of metals, including, for example, tin, indium and aluminum. Reflective metal layer 150 may also include alloys of tin, indium and aluminum or other metals. Reflective metal layer 150 may include a single type of metal, or may include a combination of metals. In some instances, reflective metal layer 150 includes at least 50%, 60%, 70%, 80%, 90%, 95% or 99%, 99.5%, 99.7% or 99.9% tin, indium or aluminum. In some instances, the semi-transmissive metal layer 130 and reflective metal layer 150 may include or consist of the same type of metal.

Reflective metal layer 150 may be deposited on spacer layer 140 using any of the techniques known in the art, including vacuum deposition, and including thermal evaporation or sputtering. In a vacuum deposition process, the source material is evaporated under a vacuum which allows vapor particles to travel directly to the spacer layer 140. The vapor particles condense onto the polymer layer, and merge with each other, to form a reflective metal layer 150. In some instances, reflective metal layer 150 may be continuous. A continuous layer may include small areas of discontinuity due to manufacturing variance. However, in some embodiments, discontinuous arrays of metal droplets, closely spaced metal particles or segments, or metal flakes that are adhered to a film or coated in a resin layer do not constitute a continuous layer. In some embodiments, reflective metal layer 150 is substantially opaque.

Reflective metal layer 150 may have a range of thicknesses. For example, reflective metal layer may have a thickness of 10 nm, 15 nm, 20 nm, 25 nm, 30 nm, 40 nm, 50 nm, 60 nm, 70 nm, 80 nm, 90 nm, 100 nm, 110 nm or more. Reflective metal layer 150 may have a thickness in a range between any of the preceding thickness values.

Adhesive layer 160 is adjacent to reflective metal layer 150. In some instances, adhesive layer 160 may be a non-reactive adhesive. A non-reactive adhesive is an adhesive that minimally changes the resistance of the reflective metal layer 150 once in contact with it. Non-reactive adhesives are generally neutral or basic in nature. In other words, a non-reactive adhesive preferably does not contain or contains only minor amounts of acid functionality.

Adhesive layer 160 may be coated onto or laminated in a roll-to-roll process to reflective metal layer 150. Adhesive layer 160 may be a pressure sensitive adhesive, a heat activated adhesive, or a cure-in-place adhesive. Adhesive layer 160 may be optically clear, or may be non-optically clear. In some instances, a primer may be used to aid adhesion between adhesive layer 160 and reflective metal layer 150. Adhesives and non-reactive adhesives may include a wide range of adhesive compositions, include, for example, polyurea, polyamide, polyurethane, polyester, addition cure silicone and combinations thereof. Adhesives consistent with the present disclosure are described in further detail in U.S. Patent Publication 2009/053337 to Everaerts et al.

In one instance, the present disclosure includes a stretchable reflective color-shifting film including a stretchable transparent polymer layer; a semi-transmissive metal layer; a transparent spacer layer; a reflective metal layer; an adhesive layer; and a stretchable base film layer. When the film body (including each of the layers) is stretched by 25%, the peak total reflectance stretched is at 80% of the peak total reflectance when the film body is unstretched according to the Total Reflectivity Test.

In another instance, the present disclosure includes a stretchable reflective color-shifting film comprising a stretchable transparent polymer layer; a semi-transmissive metal layer; a transparent spacer layer; a reflective metal layer; an adhesive layer; and a stretchable base film layer. When the film body (including each of the layers) is stretched by 25%, the peak specular reflection is at least 30% at a normal angle.

Other variations on color-shift film 100 and the particular layers are within the scope of the present disclosure. For example, in one instance, a second transparent spacer layer and a second semi-transmissive metal layer may be added to the construction to further vary the color shown in range of light reflected. In another instance, adhesive layer 180 may not be included so that the remainder of color shift film 100 can be laminated to another film construction or used in another manner. Other variations will be apparent to one skilled in the art upon reading the present disclosure.

EXAMPLES

Conformable, stretchable color shifting reflective film based articles were prepared and laminated to a base substrate with a non-reactive interlayer adhesive. Constructions were produced varying the metal selection and thickness. The resultant constructions were tested for total reflectivity, specular reflectivity, and diffuse reflectivity before and after stretching. These examples are merely for illustrative purposes only and are not meant to be limiting on the scope of the appended claims. All parts, percentages, ratios, etc. in the examples and the rest of the specification are by weight, unless noted otherwise.

TABLE 1

Materials and Sources.

| Abbreviation | Description |
|---|---|
| P1 | Aliphatic water based polyurethane, commercially available from ALBERDINGK BOLEY, Greensboro, NC as U910 |
| XL1 | 40% Carbodiimide Crosslinker commercially available from NISSHINBO CHEMICAL Inc., Toyko, Japan as CARBODILITE V-02-L2 |
| Sn | Tin Metal Shot, commercially available from Mallinckrodt Chemical Works, St. Louis, MO in a purity of 99.97% |
| Au | Au sputter material was from Materion Company in a 99.99% purity. |
| Cr | Chromium Flake, commercially available from Vacuum Engineering Materials (VEM), Santa Clara, CA in a purity of 99.99%. |
| In | Indium Foil, commercially available from Leico Industries, Inc., New York, NY in a purity of 99.9%. |
| Al | Aluminum granules, commercially available from Materion Advanced Materials, Milwaukee, WI in a purity of 99.99%. |
| OCA | 3M Optically Clear Transfer Adhesive, commercially available from 3M Company, Saint Paul, MN as 8171 |
| SV480 | 0.0508 mm (2 mil) Non-PVC print wrap film commercially available from 3M Company, Saint Paul, MN as 3M ENVISION Print Wrap Film SV480mc |
| PET Liner | 0.0508 mm (2 mil) Polyester casting liner commercially available from Mitsubishi Polyester Film, Inc., Greer, SC as HOSTAPHAN Polyester Film MT44 |
| SR833 | TRICYCLODECANE DIMETHANOL DIACRYLATE, Sartomer Americas, Exton PA, as SR833 |
| Ge | Germanium 99.9% purity sputter target commercially available from ACI Alloys, San Jose, CA. |
| CN147 | Acidic acrylate oligomer, Sartomer Americas, Exton PA, sold as CN147 |

Test Methods

Total Reflectivity

A Perkin Elmer Lambda model 1050 WB UV/VIS/NIR spectrophotometer (d/8) was used in accordance with pertinent sections of ASTM method E1164 to obtain reflection spectra to measure the Total Reflectivity (specular included) of each sample. Total Reflectivity is defined as the arithmetic mean (flat weighting) of the total spectral response (specular included) between 400-780 nm in 5 nm increments. Prior to measurement, reflection calibration was conducted using a traceable specular reference (Serial #: OMT-212046-01 available from OMT SOLUTIONS, Eindhoven, The Netherlands) across an EM band range of 350-850 nm in 1 nm increments.

Diffuse Reflectivity

A Perkin Elmer Lambda model 1050 WB UV/VIS/NIR spectrophotometer (d/8) was used in accordance with pertinent sections of ASTM method E1164 to measure the Diffuse Reflectivity (specular excluded) of each sample. Diffuse Reflectivity is defined as the arithmetic mean (flat weighting) of the diffuse spectral response, with the specular port removed, between 400-780 nm in 5 nm increments. Prior to measurement, reflection calibration was conducted using a traceable specular reference (Serial #: OMT-212046-01 available from OMT SOLUTIONS, Eindhoven, The Netherlands) across an EM band range of 350-850 in 1 nm increments.

Specular Reflectivity

A Perkin Elmer Lambda model 1050 WB UV/VIS/NIR spectrophotometer with an angle reflection accessory was used in accordance with pertinent sections of ASTM method E1164 to measure the specular reflectivity at various angles (8, 15, 30, 45, and 60 degree).

Preparation of Samples

Samples were prepared with the layers shown in FIG. 1.

Polyurethane Film Substrate (Layer 0)

A solution was produced by measuring out 40 g of U910 (P1) and slowly adding 2.7 g of XL1 (9% active ingredient by weight of P1 solids). The solution was mixed with a stir stick and then allowed to mix on a rolling bed for at least 15 minutes. The solution was coated onto the glossy side of PET Liner by using a number 28 meyer rod available from Gardco Paul N. GardnerCompany, Incorporated of Pompano Beach, Fla. Several samples were produced in this manner and were then cured in an oven at 75 C for 90 seconds, followed by 120 C for 45 seconds, and 177 C for 90 seconds. The resulting films had a coating thickness of approximately 25 um (1 mil).

Optical Layers (Layer 1, Layer 2, and Layer 3) Process

These optical layers with variable colors comprising a thin metal (Al, In, Ag, Cr, Sn, Ge, etc.) or mixture of metals (Layer 1), a cured acrylate layer (Layer 2), and a thick metal (Al, Ag, or Sn) (Layer 3), or a stack of up to 3 different layers of the metals were deposited on a polyurethane side (Layer 0) of polyurethane coated PET liner.

Figure 3:
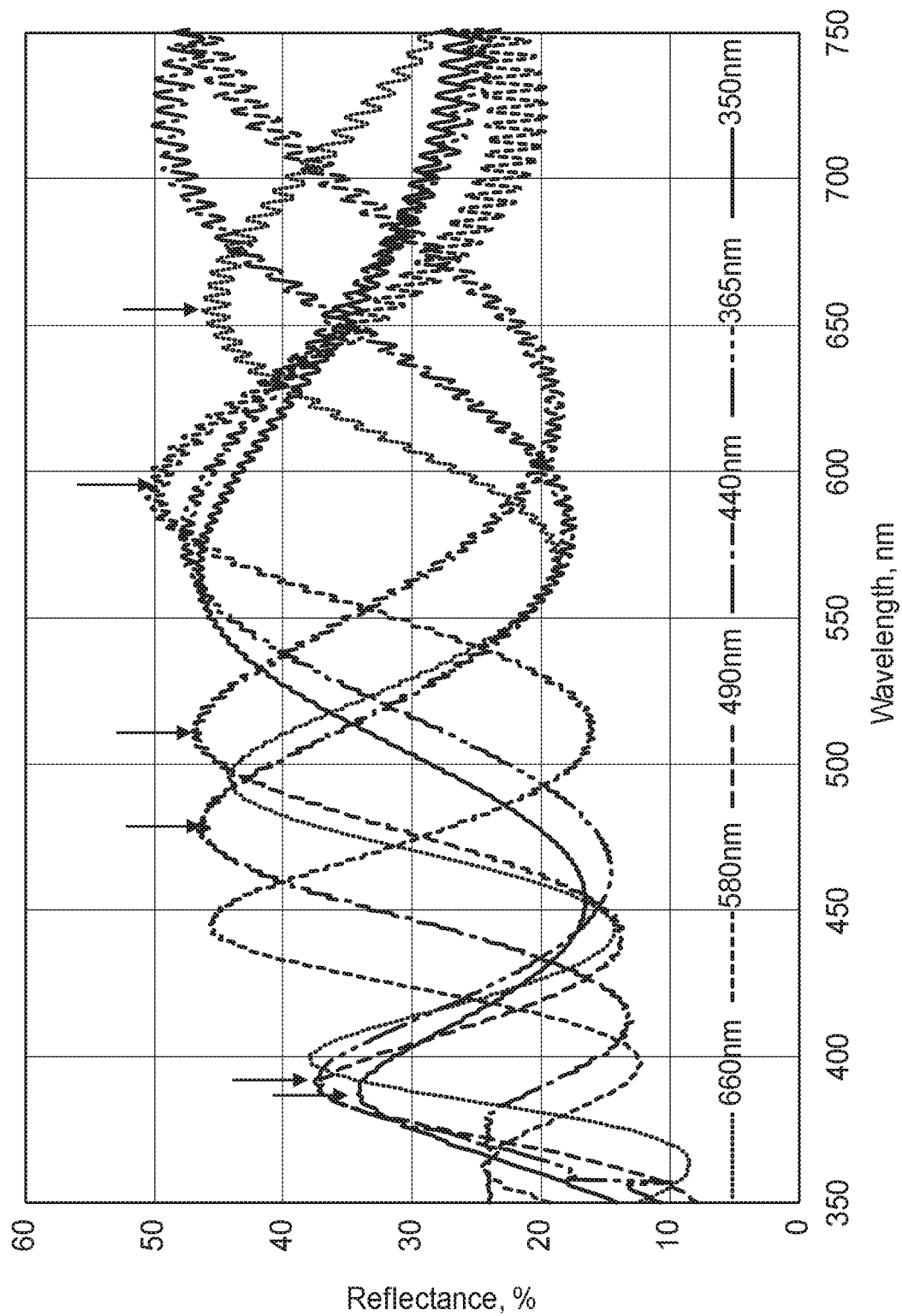
FIG. 3 shows the total reflection spectra for various spacer layer thicknesses.

All these three layers (Layer 1, Layer 2 and Layer 3) were formed using a vacuum coating apparatus similar to the one described in FIG. 3 of WO2009085741. A 0.050 mm thick PET film available from DuPont Teijin Films under the designation MELINEX 454 was used for the substrate.

(Layer 1) For the samples except of Example CE4, the precoated substrate roll was loaded into a vacuum coater and the chamber pumped down to a base pressure of less than $1 \times 10^{-4}$ Torr. A metal layer of up to 3 of the metals (either alloyed or discretely deposited as individual layers) listed in Table 1 approximately 2 nm-20 nm thick was deposited using a reactive magnetron sputtering process on Layer 1. Gas flow consisting of 100% Argon was used in the deposition process to maintain a pressure in the sputtering zone of approximately 3 mTorr. The 7 nm Au layer for Example CE4 used a thermal evaporation deposition process using Au metal material from Materion with 99.99% purity on a custom-built metal deposition coater.

(Layer 2) The film was first exposed to a N2 plasma pre-treatment process using a titanium target run at 20 W followed by an acrylate coating pass. An acrylate monomer mixture comprising 93% SR833 and 7% CN147 was flash evaporated and condensed on Layer 1 and cured with an electron beam radiation. The monomer flow rate, monomer condensation rate, and web speed were chosen to result in a predetermined cured polymer layer thickness of approximately 90 nm-700 nm (See Table 3).

(Layer 3) A metal minor 20 nm to 150 nm thick was deposited using a reactive magnetron sputtering process on Layer 2. The metal target specifications of various metals are listed in Table 1. Gas flow of 100% argon pressurized the sputtering zone to approximately 3 mTorr. The selection of materials and thickness for Layer 1-3 were varied according to Table 2.

TABLE 2

Constructions Produced for Examples or Comparative Examples

| Examples | Layer 1 | Layer 2 | Layer 3 |
| --- | --- | --- | --- |
| CE1 | 2 nm Sn | 490 nm Polyacrylate | 60 nm Sn |
| E1 | 3 nm Sn | 490 nm Polyacrylate | 60 nm Sn |
| E2 | 4 nm Sn | 490 nm Polyacrylate | 60 nm Sn |
| E3 | 6 nm Sn | 490 nm Polyacrylate | 60 nm Sn |
| E4 | 8 nm Sn | 490 nm Polyacrylate | 60 nm Sn |

TABLE 2-continued

Constructions Produced for Examples or Comparative Examples

| Examples | Layer 1 | Layer 2 | Layer 3 |
| --- | --- | --- | --- |
| E5 | 10 nm Sn | 490 nm Polyacrylate | 60 nm Sn |
| E6 | 5 nm Sn | 660 nm Polyacrylate | 60 nm Sn |
| E7 | 5 nm Sn | 580 nm Polyacrylate | 60 nm Sn |
| E8 | 5 nm Sn | 490 nm Polyacrylate | 60 nm Sn |
| E9 | 5 nm Sn | 440 nm Polyacrylate | 60 nm Sn |
| E10 | 5 nm Sn | 365 nm Polyacrylate | 60 nm Sn |
| E11 | 5 nm Sn | 350 nm Polyacrylate | 60 nm Sn |
| E12 | 6 nm Sn | 540 nm Polyacrylate | 150 nm Sn |
| E13 | 6 nm Sn | 540 nm Polyacrylate | 70 nm Ag |
| CE2 | 6 nm Sn | 540 nm Polyacrylate | 60 nm Cr |
| CE3 | 6 nm Ge | 460 nm Polyacrylate | 60 nm Al |
| CE4 | 7 nm Au | 460 nm Polyacrylate | 60 nm Sn |

Interlayer Adhesive and Lamination of Layers

Examples were produced with OCA adhesive (Layer 4), which was available in transfer film format. The OCA transfer film was laminated to the SV480 base film, followed by lamination to the laminate of polyurethane and the optical layers (Layers 1, 2 and 3). The lamination did not include heat and 178 Newtons (40 lbs.) of nip pressure was used. The PET liner was removed prior to stretching and measurements.

Unstretched Examples

Examples of each construction from Table 2-1.5 inch (3.8 cm) wide by 5 inches (12.7 cm) long were applied to, and the ends wrapped around, aluminum panels [available from Q-Lab Corp. Westlake, Ohio as Q-PANEL number ED-2.75×11NH, using 5052H38 Bare Aluminum, 0.025"×2.75"×5.5" (0.64 mm×1.08 cm×13.98 cm), Etch & Desmut panels] to create a 1.5"×2.75" (2.54 cm×6.99 cm) exposed example. Reflection values were obtained on each example.

Stretched Examples

An Instron 59CP with system ID EMSYSU4242 was used to stretch examples of each construction from Table 2 (1.5 inch (3.8 cm) wide by 5 inches (12.7 cm) long) to varying amounts of stretch (12.5%, 25%, 30%, 40%, and 50%) relative to initial 3 inch (7.62 cm) clip gap. Stretching was completed in a room at 75° F. and 75% humidity and at a stretch rate of 12 inches/minute (30.48 cm/min) for each of the constructions produced in Table 3. While the stretched film example was still clamped in the Instron, an aluminum panel (available from Q-Lab Corp. Westlake, Ohio as Q-PANEL number ED-2.75×11NH, using 5052H38 Bare Aluminum, 0.025"×2.75"×5.5" (0.64 mm×1.08 cm×13.98 cm), Etch & Desmut panels) was positioned under the example, in the center of the stretched area. Then the stretched film example was applied to the test panel, making sure it was applied without any air bubbles under the film.

Figure 2:
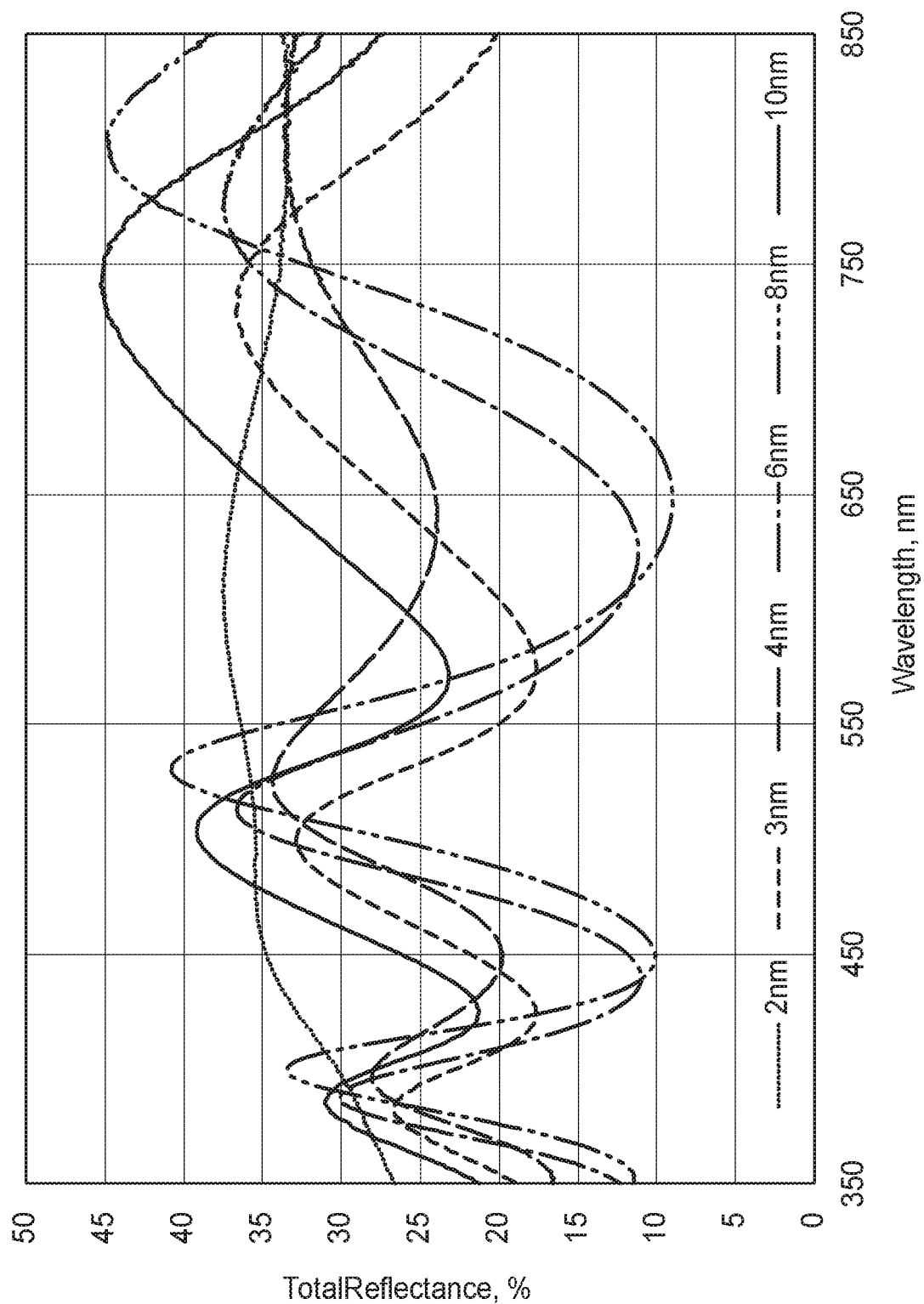
FIG. 2 is a graph showing the total reflection spectra for various semi-transmissive metal layer thicknesses.

Total and Diffuse Reflection values were obtained on each example, and Specular Reflection was also obtained at various incident angles using the methods described above. Impact of Semitransmissive Layer Thickness Upon Total Reflection Spectrum The thickness of Layer 1 has a big impact upon the film color saturation, indicated by its total reflection spectrum. As outlined in Table 2, six samples (Comparative: CE1 and Examples: E1, E2, E3, E4, and E5) with different thicknesses were produced and tested as described above. FIG. 2 shows their total reflection spectra. Table 3 shows the resulting maximum reflectance, minimum reflectance and their ratio (Rmax/Rmin) in the visible wavelength range (400 nm~700 nm) for each Layer 2 (Sn metal) thickness. Higher Rmax/Rmin created more colorful films.

TABLE 3

The impact of Layer 1 thickness upon Max and Min reflectance

| | Example | | | | | |
|---|---|---|---|---|---|---|
| | CE1 | E1 | E2 | E3 | E4 | E5 |
| Thickness, nm | 2 | 3 | 4 | 6 | 8 | 10 |
| Max Reflectance, % | 37.5 | 34.7 | 34.4 | 36.6 | 40.8 | 42.1 |
| Min Reflectance, % | 30.2 | 17.6 | 19.8 | 11.0 | 9.0 | 21.3 |
| Rmax/Rmin | 1.2 | 2.0 | 1.7 | 3.3 | 4.5 | 2.0 |

Impact of Organic Dichroic Layer Thickness Upon Total Reflection Spectrum

The organic dichroic layer thickness, also called the spacer layer, has a big impact upon the reflected film color, indicated by its total reflection spectrum. As outlined in Table 2, six samples (Examples: E6, E7, E8, E9, E10, and E11) with different thicknesses were produced and tested as described above. FIG. 3 shows their total reflection spectra. Table 4 shows the resulting reflection peak wavelength in the visible wavelength range (400 nm-700 nm) for each layer thickness. The $3^{rd}$ order peak wavelength determines the laminate color. Depending upon the thickness of this spacer layer, the layer combination may show several optical reflection peaks from constructive interference of the thin optical layer. The optical interference generated colors by one or more peaks located in the visible wavelength range.

TABLE 4

Impact of Spacer Layer (Layer 2) Thickness upon Peak Wavelength

| Layer 2 Thickness, nm | $3^{rd}$ Order Peak wavelength, nm |
|---|---|
| 660 | 655 |
| 580 | 594 |
| 490 | 511 |
| 440 | 479 |
| 365 | 394 |
| 350 | 388 |

Impact of Stretching Ratio on Total and Diffuse Reflectivity

Stretching of the Example films impacts their reflection spectra. At lower stretching ratio, specifically less than 40% for Example E7, the total reflection peaks (FIG. 4) moved to shorter wavelength. When the stretching ratio reached 40% or greater, these reflection peaks did not move further and the diffuse reflectivity (FIG. 5) became so high that the film surface looks hazy. This is caused by cracking of the optical layers (Layer 1, Layer 2 and Layer 3).

Specular Reflection with Viewing Angle for Unstretched and Stretched Laminates

Figure 6:
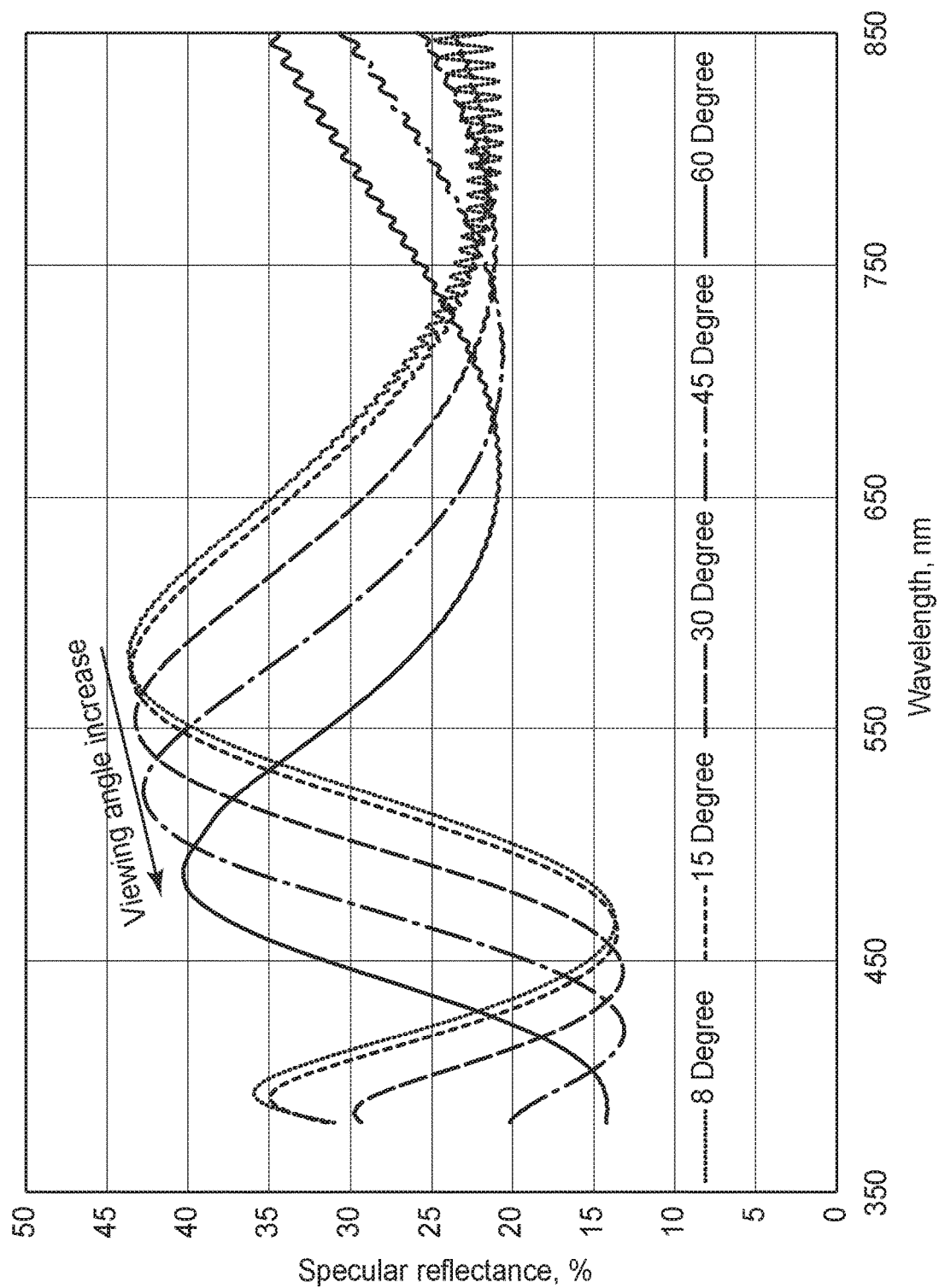
FIG. 6 shows specular reflection spectra of unstretched Example E11) at various incident angles.
Figure 7:
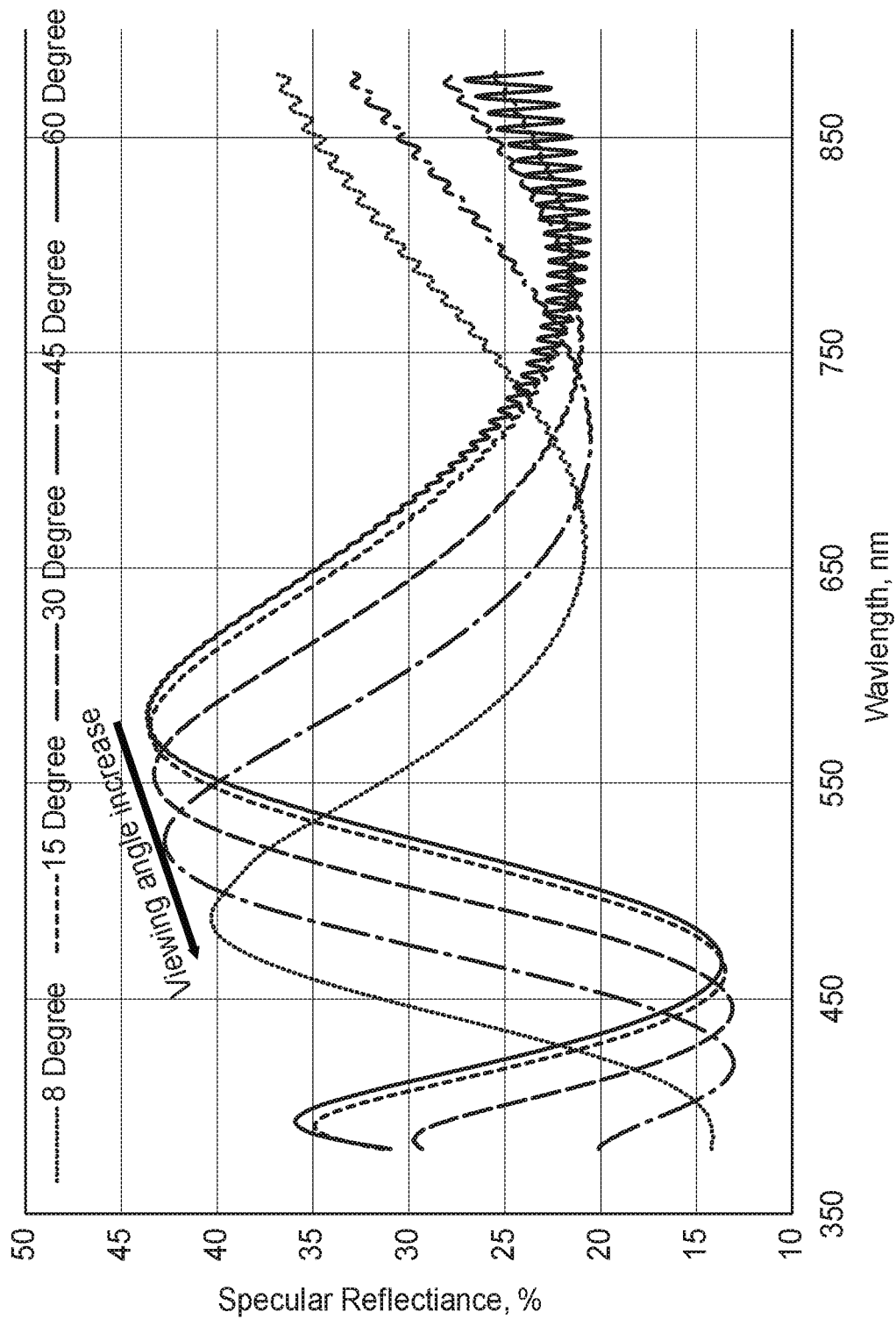
FIG. 7 shows specular reflection spectra at various incident angles of Example E11) stretched at 25%.

To some extent, all laminates made by this invention show color shifting with viewing angle. As an example, the specular reflection spectra of Example E10 were measured for the unstretched and 25% stretched samples (FIG. 6 and FIG. 7). The reflection peak moved to shorter wavelength when viewing angle increased.

Reflective Layer Metal Type Impact on Stretchability of Laminates

Figure 8A:
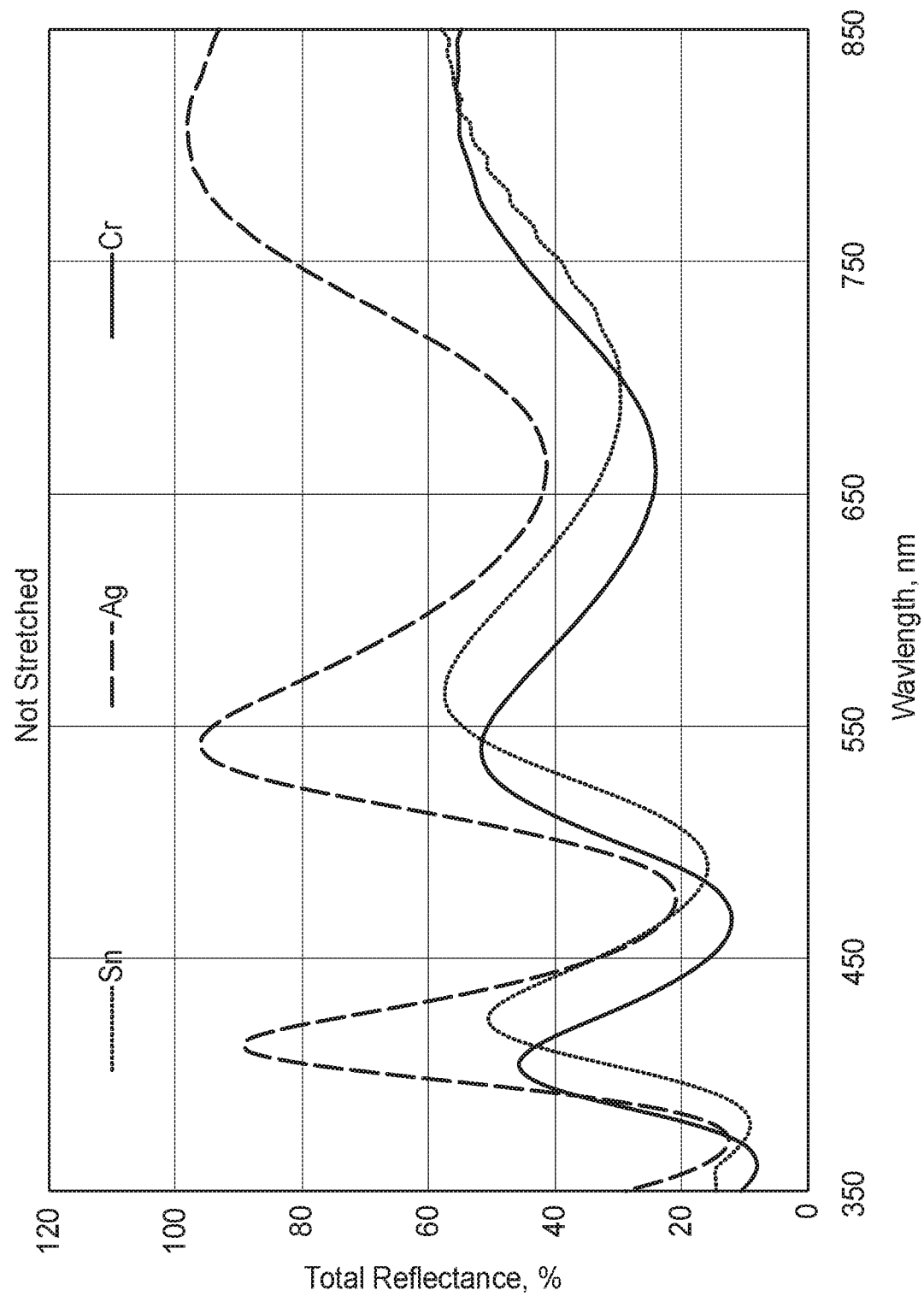
FIGS. 8A and 8B show the total reflectivity spectra of Examples E12, E13 and CE2 not stretched and stretched, respectively.
Figure 8B:
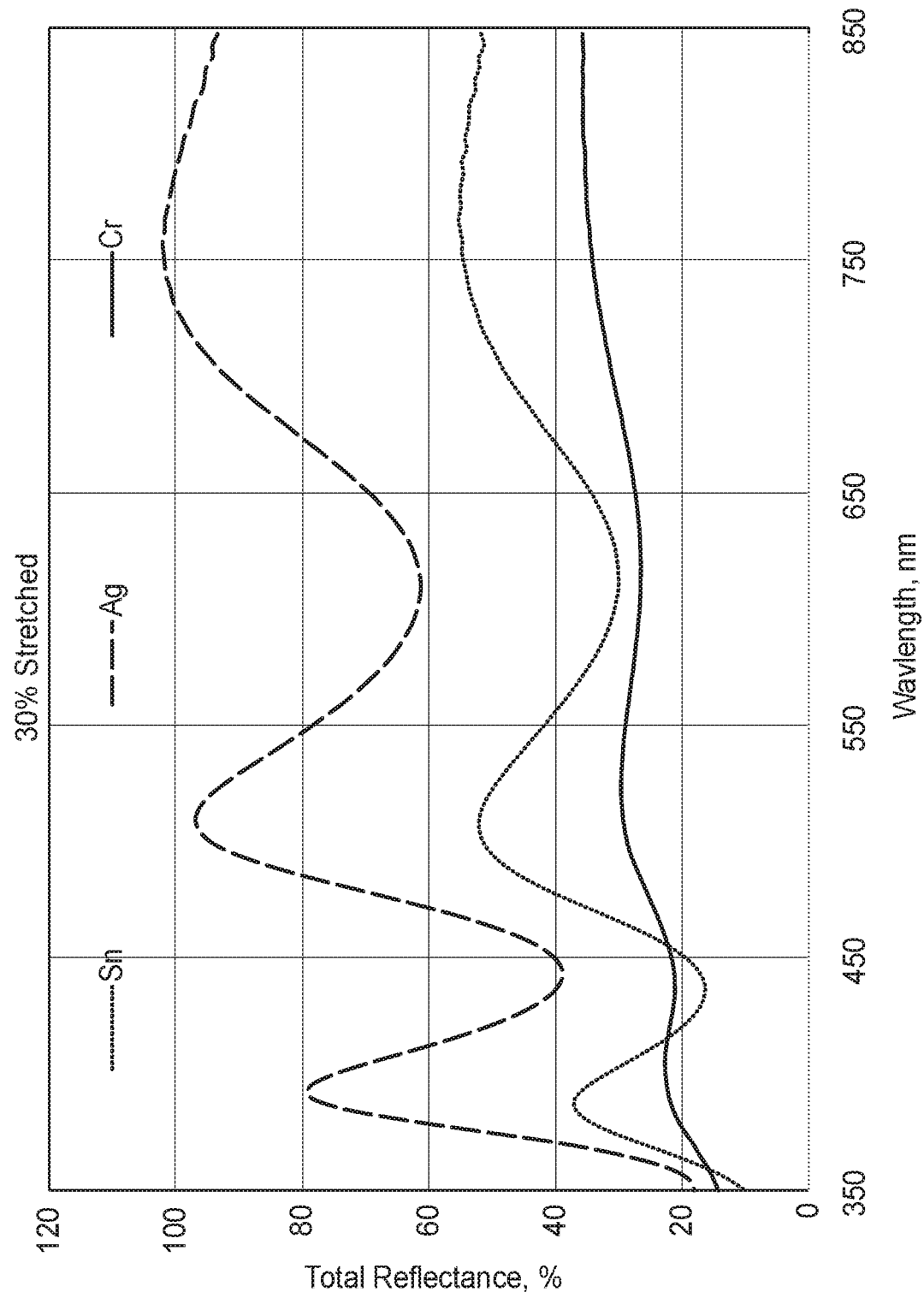

The metal type used for the reflective layer not only affects reflectivity but also the stretchability without losing the color. For example, FIGS. 8A and 8B shows the total reflectance of Examples E12, E13, CE2 stretched and not stretched. The laminates using silver and tin metals have good stretchability, which is indicated by their high reflectivity and reflection peak shifting to shorter wavelength when stretched. The laminate using chromium metal has poor stretchability, indicated by much lower reflectivity and losing its color when stretched.

Other Metal Combinations

Figure 9B:
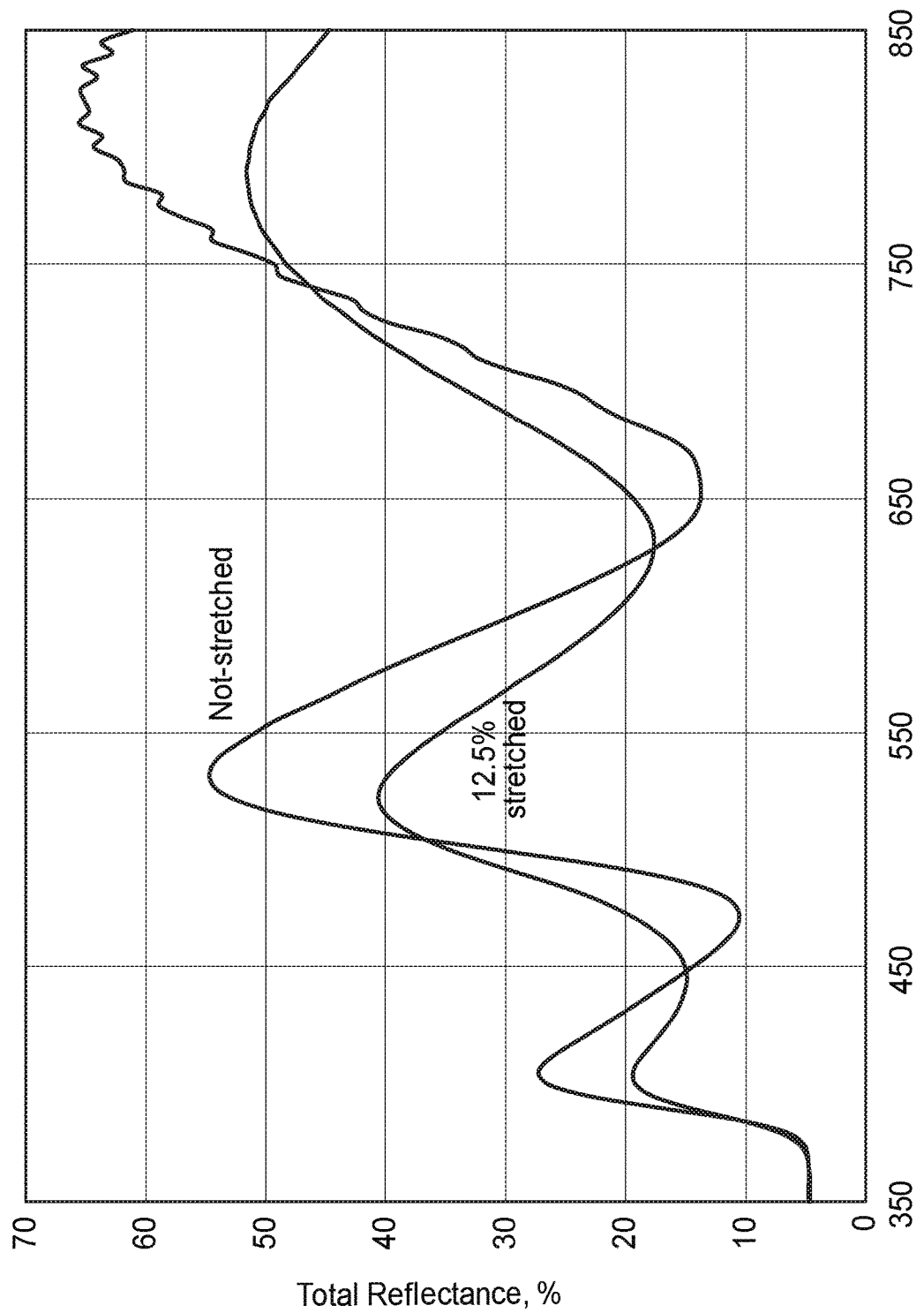

Several different metal combinations have been investigated for their properties, such as stretchability, reflectivity, and specularity, etc. As examples, Comparative Example CE3 used 6 nm germanium metal as the semitransmissive layer and 60 nm aluminum as the metal mirror layer; Comparative Example CE4 used 7 nm pure gold metal as the semitransmissive layer and 60 nm tin as the metal mirror layer. Their reflection spectra of unstretched and stretched are shown in FIGS. 9A and 9B. Both metal combinations have poor stretchability, indicated by substantial lower reflectance and no reflection peak movement after stretched.

Figure 4:
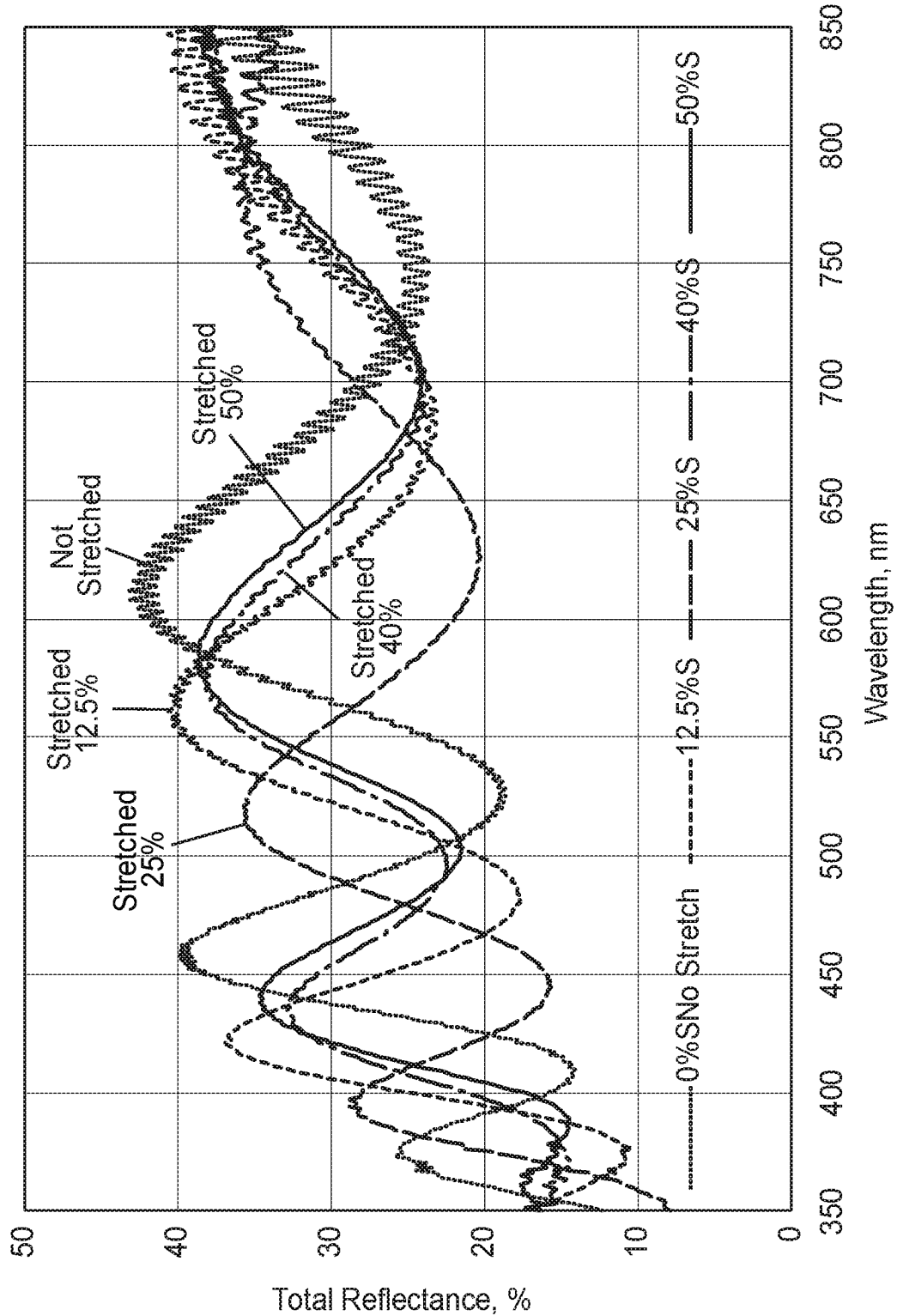
FIG. 4 shows the total reflection spectra for various stretching ratios for Example E7.
Figure 5:
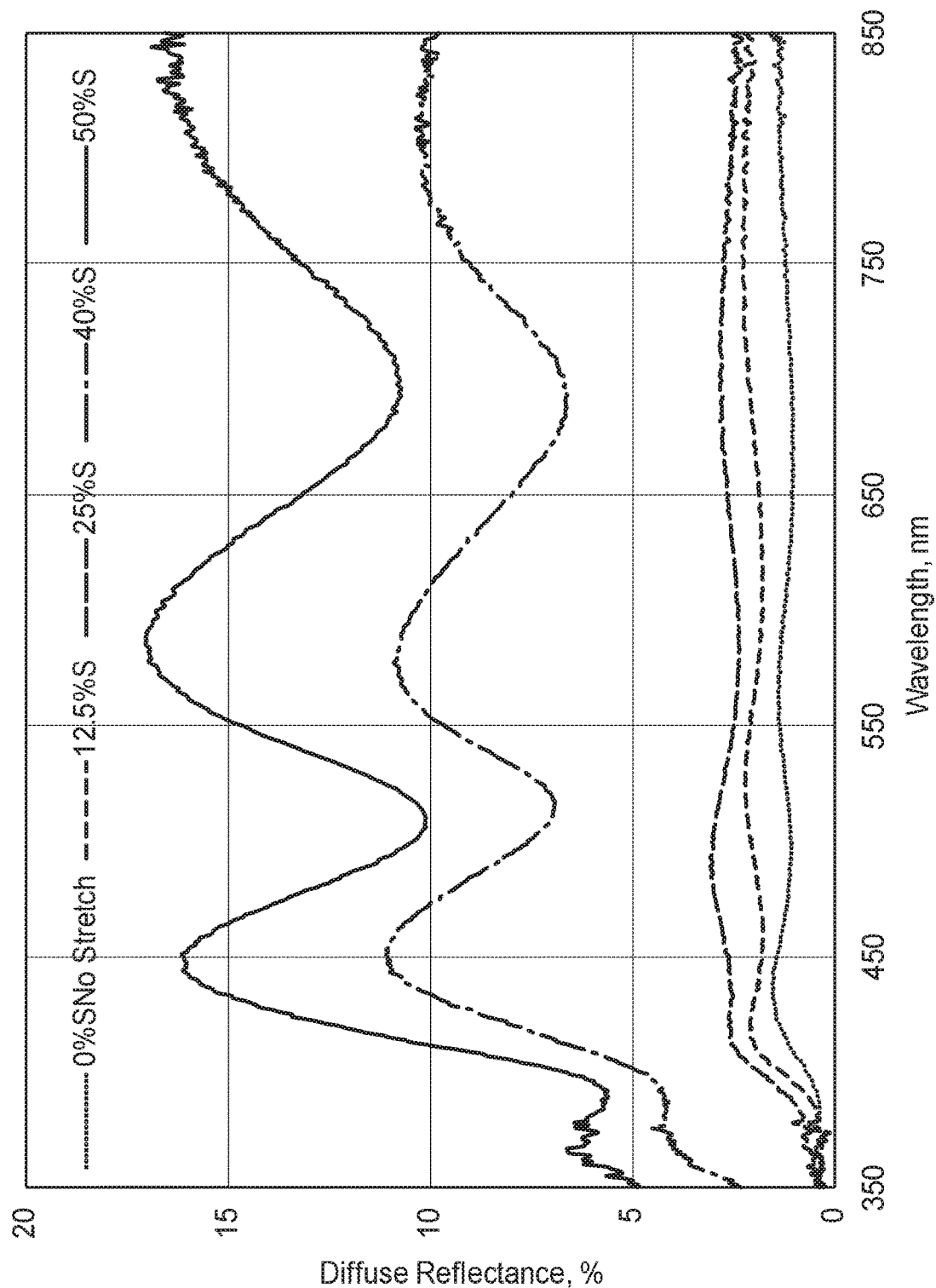
FIG. 5 shows diffuse reflection spectra for various ratios for Example E7.

| Figure # | Example # | Percentage stretched | Wavelength at PK Rtotal or Rdiffuse, nm | Peak of Rtotal or Rdffuse % | Ratio of peak total to unstretched % | Note |
|---|---|---|---|---|---|---|
| FIG. 4 | E7 | 0.0% | 612 | 43.2 | 100% | total Reflectance |
| FIG. 4 | E7a | 12.5% | 564 | 40 | 93% | total Reflectance |
| FIG. 4 | E7b | 25.0% | 519 | 35.6 | 82% | total Reflectance |
| FIG. 4 | E7c | 40.0% | 579 | 38.5 | 89% | total Reflectance |
| FIG. 4 | E7d | 50.0% | 588 | 38.6 | 89% | total Reflectance |
| FIG. 5 | E7 | 0.0% | 569 | 1.4 | 100% | diffuse reflectance |
| FIG. 5 | E7a | 12.5% | 527 | 2.2 | 157% | diffuse reflectance |
| FIG. 5 | E7b | 25.0% | 495 | 3.07 | 219% | diffuse reflectance |
| FIG. 5 | E7c | 40.0% | 452 | 11.1 | 793% | diffuse reflectance |
| FIG. 5 | E7d | 50.0% | 448 | 16.1 | 1150% | diffuse reflectance |
| FIG. 8 | E12 | 0.0% | 545 | 95.7 | 100% | total Reflectance |
| FIG. 8 | E13 | 0.0% | 565 | 57.3 | 100% | total Reflectance |
| FIG. 8 | CE2 | 0.0% | 540 | 51.3 | 100% | total Reflectance |
| FIG. 8 | E12 | 30.0% | 515 | 91 | 95% | total Reflectance |
| FIG. 8 | E13 | 30.0% | 510 | 49.2 | 86% | total Reflectance |
| FIG. 8 | CE2 | 30.0% | 520 | 27.9 | 54% | total Reflectance |
| FIG. 9 | CE3 | 0.0% | 535 | 75.9 | 100% | total Reflectance |
| FIG. 9 | CE3a | 12.5% | 535 | 46.1 | 61% | total Reflectance |
| FIG. 9 | CE3b | 25.0% | 530 | 36.1 | 48% | total Reflectance |

-continued

| Figure # | Example # | Percentage stretched | Wavelength at PK Rtotal or Rdiffuse, nm | Peak of Rtotal or Rdffuse % | Ratio of peak total to unstretched % | Note |
|---|---|---|---|---|---|---|
| FIG. 9 | CE4 | 0.0% | 535 | 54.5 | 100% | total Reflectance |
| FIG. 9 | CE4a | 12.5% | 525 | 40.6 | 74% | total Reflectance |

In summary, while the present disclosure provides several specific examples of embodiments, variations on these embodiments, within the scope of the invention, will be obvious to one of skill in the art upon reading the present disclosure. For example, a wide range of adhesives may be used to construct a stretchable reflective film, and various monomers may be used for Layer 2. A stretchable color shifting reflective film may be manufactured using other methods than those explicitly described herein. Different metal combinations, and spacer layer thicknesses could be used for achieving desired features. Other variations will be apparent to one of skill in the art upon reading the present disclosure.

What is claimed is:

1. A stretchable reflective color-shifting film comprising:
a stretchable transparent polymer layer;
a semi-transmissive metal layer;
a transparent spacer layer;
a reflective metal layer;
an adhesive layer; and
a stretchable base film layer;
wherein when the film body is stretched by 25%, the peak total reflectance when stretched is at 80% of the peak total reflectance when the film body is unstretched according to the Total Reflectivity Test, wherein when the film body is stretched by 25%, the peak specular reflection is at least 30% at a normal angle.

2. The color-shifting film of claim 1, further comprising a second transparent spacer layer and a second semi-transmissive metal layer.

3. The color-shifting film of claim 1, wherein the transparent spacer layer comprises an organic material.

4. The color-shifting film of claim 1, wherein the semi-transmissive metal layer comprising at least one of tin, aluminum or indium.

5. The color-shifting film of claim 1, wherein the reflective metal layer comprises at least one of tin, aluminum or indium.

6. The color-shifting film of claim 1, wherein the semi-transmissive metal layer and the reflective metal layer comprise the same type of metal.

7. The color shifting film of claim 1, further comprising a user adhesive layer disposed on the side of the stretchable base film layer opposite the adhesive layer.

8. The color shifting film of claim 1, wherein the spacer layer has a thickness in the range of 350 nm to 700 nm.

9. A stretchable reflective color-shifting film comprising:
a stretchable transparent polymer layer;
a semi-transmissive metal layer;
a transparent spacer layer;
a reflective metal layer;
an adhesive layer; and
a stretchable base film layer;
wherein when the film body is stretched by 25%, the peak specular reflection is at least 30% at a normal angle.

10. The color-shifting film of claim 9, further comprising a second transparent spacer layer and a second semi-transmissive metal layer.

11. The color-shifting film of claim 9, wherein the transparent spacer layer comprises an organic material.

12. The color-shifting film of claim 9, wherein the semi-transmissive metal layer comprising at least one of tin, aluminum or indium.

13. The color-shifting film of claim 9, wherein the reflective metal layer comprises at least one of tin, aluminum or indium.

14. The color-shifting film of claim 9, wherein the semi-transmissive metal layer and the reflective metal layer comprise the same type of metal.

15. The color shifting film of claim 9, further comprising a user adhesive layer disposed on the side of the stretchable base film layer opposite the adhesive layer.

16. The color shifting film of claim 9, wherein spacer layer has a thickness in the range of 350 nm to 700 nm.

* * * * *